United States Patent
Praveena (10) Patent No.: US 8,384,468 B2
(45) Date of Patent: Feb. 26, 2013

(54) MULTI-SUPPLY VOLTAGE COMPATIBLE I/O RING

(75) Inventor: H. C. Praveena, Greater Noida (IN)

(73) Assignee: STMicroelectronics International N.V., Amsterdam (NL)

( * ) Notice: Subject to any disclaimer, the term of this patent is extended or adjusted under 35 U.S.C. 154(b) by 357 days.

(21) Appl. No.: 12/732,604

(22) Filed: Mar. 26, 2010

(65) Prior Publication Data

US 2011/0102062 A1 May 5, 2011

(30) Foreign Application Priority Data

Nov. 3, 2009 (IN) .......................... 2254/DEL/2009

(51) Int. Cl.
*G05F 1/10* (2006.01)

(52) U.S. Cl. ........................... 327/538; 327/77; 327/565

(58) Field of Classification Search .................... 326/56; 327/72, 74, 77, 534, 538, 564, 565
See application file for complete search history.

(56) References Cited

U.S. PATENT DOCUMENTS

| | | | |
|---|---|---|---|
| 6,380,758 B1 * | 4/2002 | Hsu et al. | 326/30 |
| 7,495,269 B2 * | 2/2009 | Katoh | 257/203 |
| 7,759,972 B1 * | 7/2010 | Shumarayev et al. | 326/41 |
| 8,106,705 B2 * | 1/2012 | Negoi | 327/538 |

* cited by examiner

*Primary Examiner* — Jeffrey Zweizig
(74) *Attorney, Agent, or Firm* — Hogan Lovells US LLP (57) ABSTRACT

Systems and methods for achieving multiple supply voltage compatibility of an input/output (I/O) ring of an integrated circuit (IC) chip. The IC chip includes a core surrounded by the I/O ring which includes a voltage detector circuit. An I/O supply voltage of the IC chip is sensed by the voltage detector circuit to generate a control signal. The control signal is used to configure the I/O ring to operate at the I/O supply voltage of the I/O ring, thus enabling the IC to operate at multiple supply voltage levels.

18 Claims, 5 Drawing Sheets

MULTI-SUPPLY VOLTAGE COMPATIBLE I/O RING

RELATED APPLICATION

The present application claims priority of India Patent Application No. 2254/DEL/2009 filed Nov. 3, 2009, which is incorporated by reference herein in its entirety.

FIELD OF THE INVENTION

The present application relates generally to electronic chips and, in particular, to an input-output ring of an integrated circuit chip that can operate at multiple supply voltages.

BACKGROUND

Electronic devices, such as mobiles phones, personal digital assistants (PDAs), cameras, computers, etc., are provided with integrated circuit (IC) chips that perform multiple functions such as computing, voice communication, image and video processing, and storing of information. Nowadays, users prefer compact electronic devices that can support a number of functionalities and have an extended battery life. As a result, there has been a continuous decrease in the size of the IC chips and an increase in the number of functionalities provided by the IC chips. This decrease in the size necessitates a reduction of the level of supply voltage at which the IC chips operate and also reduces power consumption of the IC chips.

A typical IC chip includes a core, an input-output (I/O) ring, and I/O pads. The core includes circuits to perform various functions and also interacts with peripheral circuits through the I/O pads. The core is connected to the I/O pads via the I/O ring. The I/O ring includes multiple I/O cells, which are coupled to the I/O pads. The I/O cells include circuits to provide an interface between the core and the peripheral circuits. Both the core and the I/O ring operate at their respective levels of supply voltage. Generally, the core operates at a level of supply voltage that is lower than that of the I/O ring. However, the I/O ring is usually configured to operate at the same level of supply voltage as the IC chip. If the level of supply voltage at which the IC chip operates is to be changed, the I/O ring becomes obsolete as the I/O ring is configured to operate at a particular supply voltage level only. Thus, the I/O ring has to be re-fabricated for a new level of IC supply voltage.

SUMMARY OF THE INVENTION

This summary is provided to introduce a system and method for implementing a multiple supply voltage compatible I/O ring.

An integrated circuit (IC) chip as described herein includes a core, an I/O ring, and a voltage detector circuit. The core performs multiple functionalities, such as computing and storage of information. The I/O ring includes circuits to process and exchange signals between the core and the peripheral circuits. The voltage detector circuit is placed in the I/O ring surrounding the core.

In an implementation, a level of an I/O supply voltage is sensed by the voltage detector circuit to generate a control signal. The control signal configures the I/O ring to operate at the I/O supply voltage level of the IC chip.

These and other features, aspects, and advantages of the present subject matter will be better understood with reference to the following description. This summary is provided to introduce a selection of concepts. This summary is not intended to identify key features or essential features of the claimed subject matter, nor is it intended to be used for limiting the scope of the claimed subject matter.

BRIEF DESCRIPTION OF THE DRAWINGS

The detailed description is provided with reference to the accompanying figures. In the figures, the left-most digit(s) of a reference number identifies the figure in which the reference number first appears. The same numbers are used throughout the drawings to reference like features and components.

DETAILED DESCRIPTION OF PREFERRED EMBODIMENTS

The disclosed subject matter relates to a system and method for providing an electronic device with multiple supply voltage compatibility. The system and method described herein, in particular, relate to multiple supply voltage compatibility for an I/O ring of an integrated circuit (IC) chip.

Electronic devices, such as mobiles phones, microprocessors, micro-controllers, information storage devices, use IC chips to perform a number of functions including computing, data processing, image processing, and data storage. The IC chips, including the ones disclosed herein, are generally fabricated from a semiconducting material such as silicon and germanium. With advancements in the fabrication technology in the last decade, the size of the IC chips has reduced considerably. With this reduction in size, there has been a parallel decrease in the IC supply voltage at which the IC chips operate. As a consequence of this decrease, the power consumption and heat dissipation in the IC chips has also reduced. Functionalities of the IC chips, however, have not been compromised at the cost of decrease in size of the IC chips.

An IC chip typically includes a core operating at a core supply voltage. The core includes circuits to perform multiple functions provided by the IC chip. The circuits placed around the IC chip are known as peripheral circuits. The peripheral circuits interact with the core through multiple I/O cells of the IC chip. An I/O cell includes circuits, for example, a pre-driver circuit, a driver circuit, etc., to process and exchange signals between the core and the peripheral circuits. Further, the I/O cell includes circuits to meet signal specifications, such as rise-time and signal-to-noise ratio, of the peripheral circuits. Each I/O cell is attached to an I/O pad, which is further connected to a pin. The pin can be physically seen outside the body of the IC chip. Additionally, the IC chip includes supply cells to provide an I/O supply voltage to the I/O cells.

Typically, the I/O cells operate at a particular I/O supply voltage, which is determined during the design phase of the IC chip. Some voltage levels at which the I/O cells have been typically operated are about 1.2 V, 1.8 V, and 2.8 V. However, the level of the supply voltage or operating voltage has decreased over the past few years, and may decrease further in the coming years. Thus, for a new I/O supply voltage, the I/O cell has to be redesigned, thereby increasing the cost of fabrication.

Generally, when an I/O cell is to be designed such that it can operate at multiple I/O supply voltage, a control signal is generated from the core to indicate the I/O supply voltage to the I/O cell. However, a control signal from the core has to be first level shifted to the I/O supply voltage. With any decrease in the core supply voltage, the size of level shifter circuits in the I/O cell would increase, thereby increasing the size of the IC chip. Also, the control signal from the core needs a controller in the core, thereby consuming resources of the core. The control signal, if generated externally, is routed to I/O cells through the I/O pads. The extra I/O pads, for routing the control signal, increase the size of the IC chip without any increase in the functionalities provided by the IC chip. Moreover, both of these above methods require an input from the user to specify the I/O supply voltage for generating the control signal.

In one implementation, according to the present subject matter, a voltage detector circuit present in the I/O ring senses a level of the I/O supply voltage to generate a control signal. The control signal is then routed to the I/O cells. The I/O cells are configured to operate at the I/O supply voltage based on the control signal generated by the voltage detector circuit. The I/O cells can be automatically configured to operate at the I/O supply voltage without any manual intervention. The chances of manual errors in generating the control signal is thus minimized. Further, the control signal is routed to the I/O cells internally in the I/O ring, thus avoiding usage of the I/O pads. Thus, the size of the IC chip is reduced, or the number of functions provided by the IC chip can be increased. Moreover, the I/O cells are configured to meet the specifications of the peripheral circuit at any I/O supply voltage. Further, in an embodiment, the control signal that configures all the I/O cells may be generated from a single voltage detector circuit placed in the I/O ring.

While aspects of described system and method for the multiple supply voltage compatibility of the IC chip can be implemented in any number of different IC chips, environments, and/or configurations, the embodiments are described in the context of the following exemplary system architecture(s).

Figure 1:
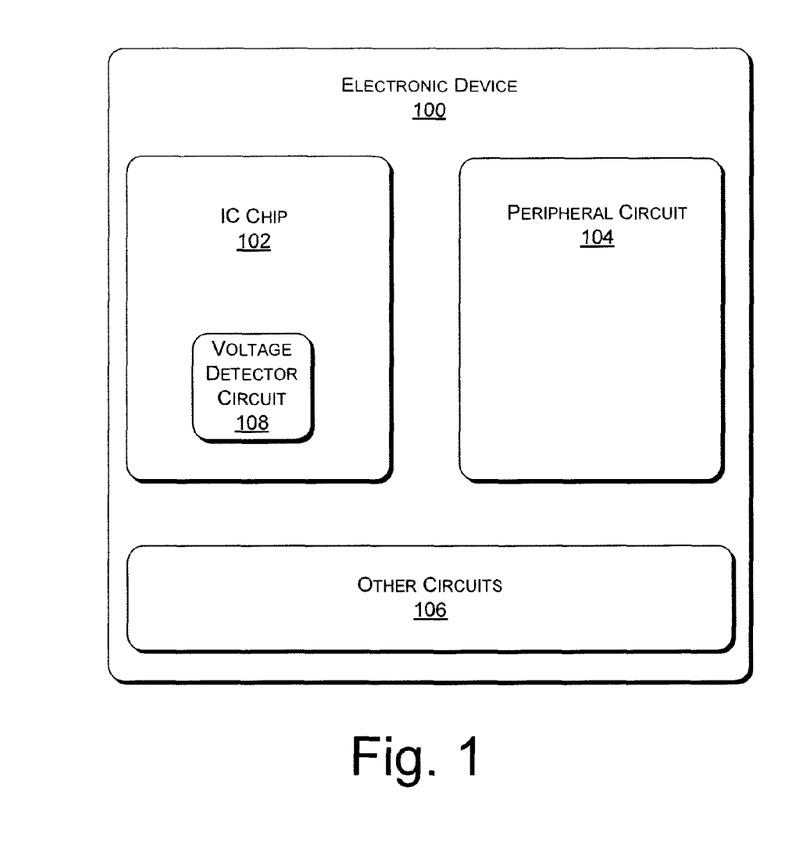
FIG. 1 illustrates an exemplary architecture of an electronic device in which an embodiment of the present invention is implemented.

FIG. 1 illustrates an exemplary architecture of an electronic device 100, in which an embodiment of the present subject matter is implemented. The electronic device 100 includes an IC chip 102, a peripheral circuit 104, and other circuits 106. The electronic device 100 may include, but is not limited to, a server, a desktop PC, a notebook, a portable computer, a workstation, a mainframe computer, a game console, a DVD player, an entertainment device, a mobile phone, a personal digital assistant, and a portable memory.

The IC chip 102 and the peripheral circuit 104 interact with each other by exchanging signals during the operation of the electronic device 100. The IC chip 102 performs various functions, such as computing, storage of information, video and audio processing, etc., which are provided by the electronic device 100. The peripheral circuit 104 includes circuits to provide an interface between the IC chip 102 and outside the electronic device 100. Examples of the peripheral circuit 104 may include a graphics controller, a universal serial bus (USB) controller, a network controller, a keyboard interface, etc. In an implementation, the peripheral circuit 104 can be in an another IC chip, which interacts with the IC chip 102. In an another implementation, the peripheral circuit 104 may be fabricated along with the IC chip 102 to form a single IC chip. The other circuits 106 may include circuits to perform any additional functionality provided by the electronic device 100.

The IC chip 102 includes a voltage detector circuit 108. The voltage detector circuit 108 senses a level of an I/O supply voltage, which is derived from an IC supply voltage at which the IC chip 102 operates, to configure the IC chip 102 to operate at the level of the I/O supply voltage. The working of the voltage detector circuit 108 is explained in greater detail with the help of FIGS. 2 and 3.

Figure 2:
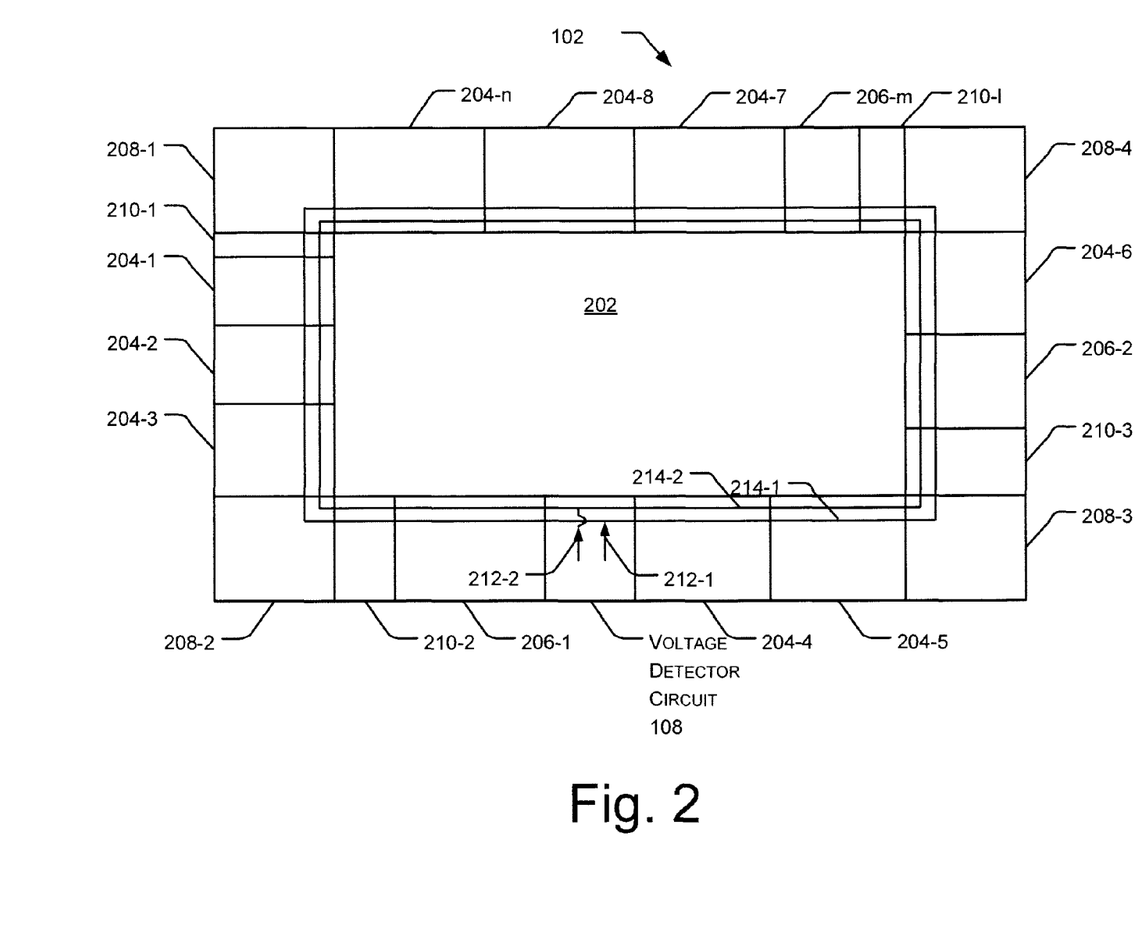
FIG. 2 illustrates an exemplary architecture of an integrated circuit (IC) chip with multiple supply voltage compatibility, according to an embodiment of the present invention.

FIG. 2 illustrates an exemplary architecture of the IC chip 102 with multiple supply voltage compatibility. In an embodiment, the IC chip 102 includes a core 202; I/O cells 204-1, 204-2, . . . , 204-$n$, collectively referred to as I/O cells 204; the voltage detector circuit 108, multiple filler cells 206-1, 206-2, . . . , 206-$m$, collectively referred to as filler cells 206; corner cells 208-1, 208-2, 208-3, and 208-4, collectively referred to as corner cells 208; and supply cells 210-1, 210-2, . . . , 210-L, collectively referred to as supply cells 210. Each I/O cell, such as the I/O cell 204-1, is connected to an I/O pad (not shown in FIG. 2). The core 202 interacts with peripheral circuits, such as the peripheral circuit 104, by exchanging signals through the I/O cells 204.

The I/O cells 204, the voltage detector circuit 108, the filler cells 206, the corner cells 208, and the supply cells 210 surround the core 202 to form a ring, also known as I/O ring. In an embodiment, the voltage detector circuit 108 may be fabricated in any of the corner cells 208 or the filler cells 206.

In an embodiment, the core 202 includes circuits for a microprocessor, a microcontroller, a video decoder, a memory, etc. These circuits in the core 202 operate at a core supply voltage. On the other hand, the I/O cells 204 operate at the I/O supply voltage. The core supply voltage and the I/O supply voltage are derived from the IC supply voltage. In an embodiment, separate supply voltages may be connected to the IC chip 102 to provide the core supply voltage and the I/O supply voltage.

The voltage detector circuit 108 senses a level of the I/O supply voltage to generate a control signal, depicted by bit lines 212-1 and 212-2 (collectively referred to as bit lines 212). The control signal, as depicted by the bit lines 212 is routed to the I/O cells 204 through digital rails 214-1 and 214-2, collectively referred to as digital rails 214. The digital rails 214 may be fabricated in the I/O ring, outside the core 202. In the embodiment shown, the control signal is of two-bit resolution. Thus the number of the levels of the I/O supply voltage that can be represented is four. In an implementation, if the number of the levels of the I/O supply voltage is more than four, the number of bits of the control signal can be increased. For example, when the number of the levels of the I/O supply voltage is six, a three bit control signal may be generated as the bit lines 212-1, 212-2, and 212-3 and may be provided to the I/O cells 204.

Figure 3:
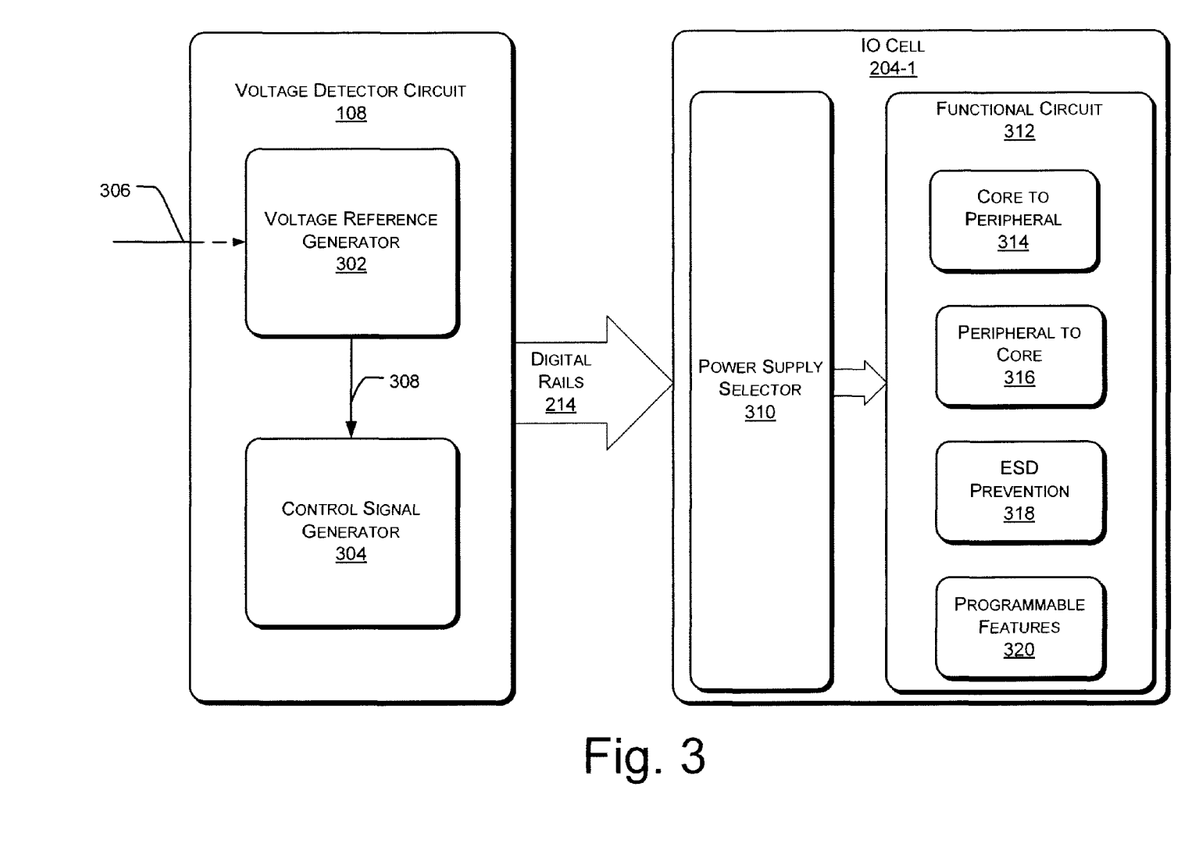
FIG. 3 illustrates an exemplary structure of a voltage detector circuit and an I/O cell, according to an embodiment of the present invention.

FIG. 3 shows a block implementation of the voltage detector circuit 108 explaining the functioning of the voltage detector circuit 108. For illustration purpose, the voltage detector circuit 108 is shown coupled to an I/O cell, for example, the I/O cell 204-1. The voltage detector circuit 108 includes a voltage reference generator 302 and a control signal generator 304.

The voltage reference generator 302 receives an input signal 306, such as the I/O supply voltage, to generate a reference voltage 308. In an implementation, the input signal 306 is the I/O supply voltage. The reference voltage 308 remains at a constant voltage level irrespective of the level of the input signal 306, temperature, noise level, etc. The control signal generator 304 receives the reference voltage 308 and the input signal 306 to generate the control signal. The control signal may be routed to the I/O cell 204-1 through the digital rails 214.

Using a single voltage detector circuit, namely the voltage detector circuit 108, coupled to the I/O cells 204 can configure the I/O cells 204 to operate at the I/O supply voltage. The size of each of the I/O cells 204 is correspondingly reduced and the I/O cells 204 can be configured to operate at any I/O supply voltage provided to the IC chip 102 by the voltage detector circuit 108.

Further, the voltage reference generator 302 in the voltage detector circuit 108 requires a supply voltage at all times during the operation of the IC chip 102 to provide the constant reference voltage 308. This is generally supplied by the input signal 306. Thus, power consumption in the signal implementation of the voltage detector circuit 108 as compared with the power consumption when a voltage detector circuit is implemented for each of the I/O cells 204, is considerably reduced.

As mentioned previously, the control signal is routed to the I/O cells 204. An I/O cell, for example the I/O cell 204-1, includes a power supply selector circuit 310 and a functional circuit 312. The power supply selector circuit 310 receives the control signal through the digital rails 214, and configures the functional circuit 312 to operate at the I/O supply voltage. In an embodiment, the power supply selector circuit 310 includes switches to configure the functional circuit 312 to operate at the I/O supply voltage.

The functional circuit 312 includes circuits to exchange signals between the core 202 and the peripheral circuit 104. As shown in FIG. 3, and according to an implementation, the functional circuit 312 includes a core to peripheral block 314, a peripheral to core block 316, an electrostatic discharge (ESD) prevention block 318, and a programmable features block 320. These blocks are configured to perform functions such as exchange of signals between the core 202 and the peripheral circuit 104, protection from electrostatic discharge, etc.

The core to peripheral block 314 is configured to receive a signal from the core 202 at the core supply voltage. The signal received is subsequently level shifted to the I/O supply voltage. The peripheral circuit 104 demands certain signal characteristics, such as a particular rise-time, signal-to-noise ratio, and a voltage level, for its proper functioning. The core to peripheral block 314 is configured to provide these signal characteristics to the peripheral circuit 104. In an implementation, the core to peripheral block 314 includes a pre-driver circuit and a driver circuit to provide the signal characteristics.

When the control signal, such as the bit lines 212, is received by the power supply selector circuit 310, the control signal configures the core to peripheral block 314 to operate at the I/O supply voltage. In an implementation, the control signal may configure the core to peripheral block 314 to provide the signal characteristics to the peripheral circuit 104. In an implementation, the power supply selector circuit 310 turns ON or OFF certain switches so that the core to peripheral block 314 can provide the signal characteristics to the peripheral circuit 104.

The peripheral to core block 316 is configured to receive a signal from the peripheral circuit 104, the signal being at the I/O supply voltage. This signal is level shifted to the core supply voltage by the peripheral to core block 316. In an implementation, the peripheral to core block 316 includes level shifter circuits for converting the signal, which is at the I/O supply voltage, to the core supply voltage. The power supply selector circuit 310 also configures the peripheral to core block 316 to operate at the I/O supply voltage. In an implementation, switches present in the power supply selector circuit 310 configure the peripheral to core block 316 to operate at the I/O supply voltage.

The ESD prevention block 318 of the functional circuit 312 is configured to prevent the IC chip 102 from electrostatic discharges. The programmable features block 320 configures the I/O cell 204-1 for various functions provided by the IC chip 102. These functions may include providing a serial port, a parallel port, a graphics card slot, a memory slot, a USB port, etc.

Figure 4:
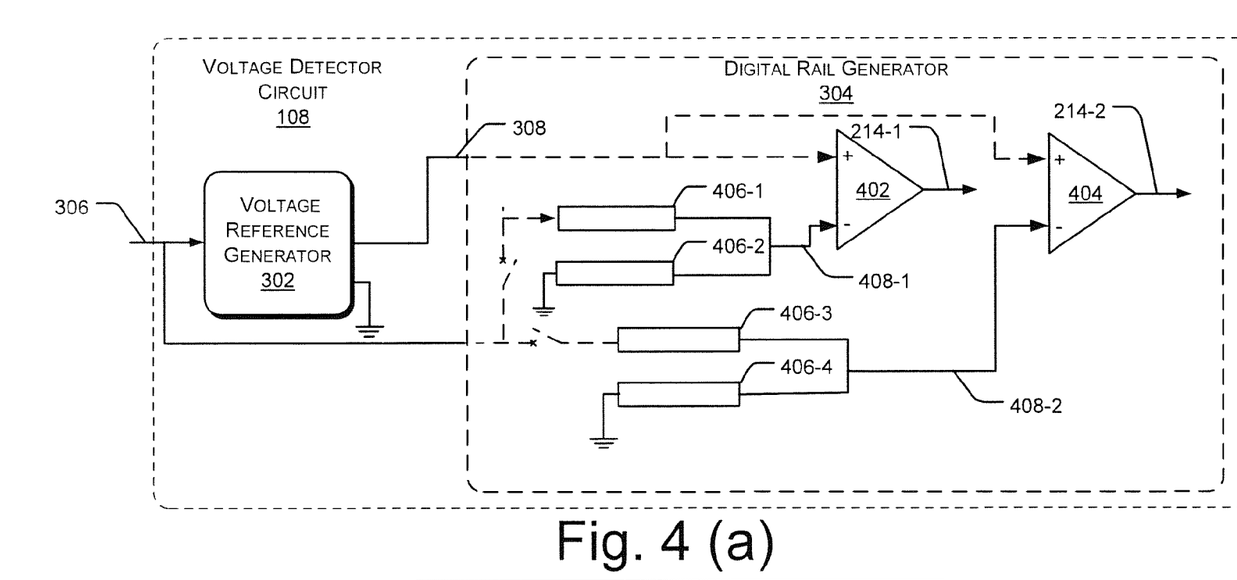
FIG. 4(a) illustrates an exemplary embodiment of the voltage detector circuit of an embodiment of the present invention.
FIG. 4(b) illustrates an exemplary table illustrating control signal values generated for different supply voltage levels.

FIG. 4(a) illustrates an implementation of the voltage detector circuit 108, in one embodiment. The voltage reference generator 302 is configured to generate a reference voltage such as the reference voltage 308. As mentioned previously, In an implementation, the reference voltage 308 remains constant irrespective of a supply voltage of the voltage reference generator 302. The supply voltage of the voltage reference generator 302 can be same as the I/O supply voltage. In the embodiment shown in FIG. 4, the input signal 306 is the I/O supply voltage.

The voltage reference generator 302 used herein can be any voltage reference generator known in the art. The control signal generator 304 receives the input signal 306 and the reference voltage 308 to generate the control signal. For the purpose, in one embodiment, the control signal generator 304 includes comparators 402 and 404, and resistors 406-1, 406-2, 406-3, and 406-4. The input signal 306 is passed through the resistors 406-1 and 406-2 to generate a first comparator signal 408-1 and through the resistors 406-3 and 406-4 to generate a second comparator signal 408-2. The first comparator signal 408-1 and the second comparator signal 408-2 are a fraction of the I/O supply voltage. The comparator 402 receives the reference voltage 308 and the first comparator voltage 408-1 to generate the bit line 212-1. Similarly, the comparator 404 receives the reference voltage 308 and the second comparator signal 408-2 to generate the bit line 212-2.

The control signal 212 corresponds to a level of the I/O supply voltage at which the I/O cells 204 have to be configured for operation. For illustration purpose, if there are four levels of the I/O supply voltage, the control signal can be a two bit value to select any one of the four levels. This has been tabulated in FIG. 4(b), indicating the control signal bits for the four levels. Rows 410-1, 410-2, 410-3, and 410-4, collectively referred to as rows 410, illustrate sample values of the control signal, such as the bit lines 212, generated for the four levels of the I/O supply voltage. For the purpose of illustration, the input signal 306 is assumed to take values in four ranges.

The row 410-1 shows the control signal for range 1 of the I/O supply voltage, with both the bit lines 212-1 and 212-2 being 0. Similarly, the row 410-2 shows the control signal for the I/O supply voltage being in range 2 as the bit line 212-1 sending a 0 and the bit line 212-2 sending a 1. For range 3, the bit lines 212-1 and 212-2 are sending 1 and 0, respectively, as represented by row 410-3. For range 4, the bit lines 212-1 and 212-2 both conduct 1, as represented by row 410-4.

As an example to facilitate the understanding of the voltage detector circuit 108, consider the I/O supply voltage is 1.8 V and the reference voltage 308 is 0.5 V. The first comparator signal 408-1, as generated from the I/O supply voltage, is say 0.8 V, and the second comparator signal 408-2 is 0.7 V. The bit lines 212-1 and 212-2, as generated by the comparators 402 and 404, will be 0 and 0, respectively. Further, Suppose the I/O supply voltage is changed to 1.2 V, and the first comparator signal 408-1 and the second comparator signal 408-2 are 0.53 V and 0.46 V, respectively. In that case, the bit lines 212-1 and 212-2 will be 0 and 1, respectively.

It may be understood that the above example is for illustrative purposes only therefore shall not be construed, in any way, as a limiting factor of the present subject matter. The embodiment shown in FIG. 4(a) is configured to detect four voltage levels as illustrated above. However, the voltage detector circuit 108 can also be used to detect multiple levels of the supply voltage, by extending the above embodiment.

The voltage detector circuit 108, as described above, allows the IC chip 102 to automatically configure the I/O cells 204 to the I/O supply voltage. There is no need of any manual intervention to implement multiple supply compatibility for the I/O cells 204 and for the I/O ring. The present subject matter when implemented, does not require any I/O pads for routing the control signals to the I/O cells 204, thus saving on I/O pad area. This area saving leads to decrease in the area of the IC chip 102. Further, the I/O ring, as depicted, can be operated at multiple supply voltages of the IC chip 102.

Figure 5:
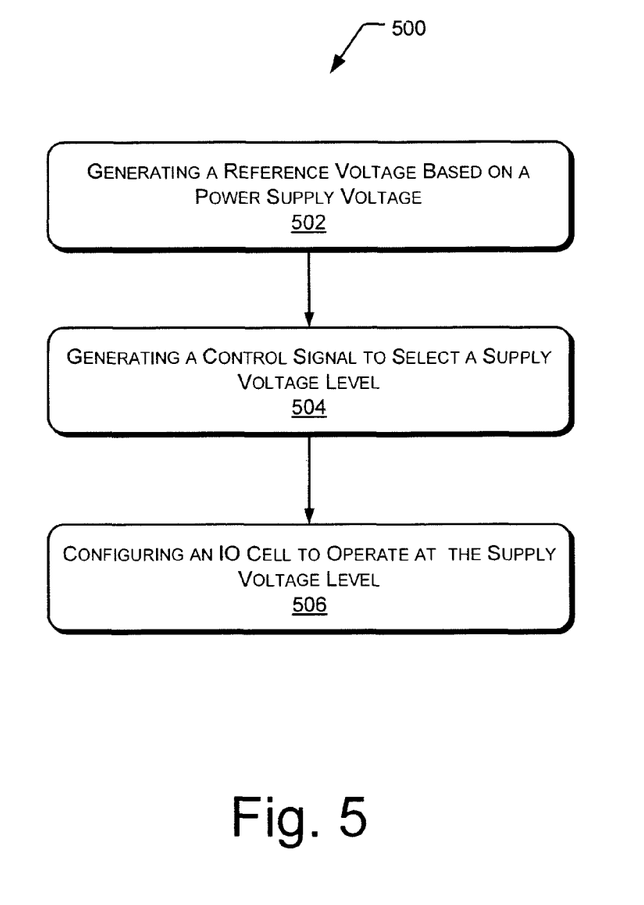
FIG. 5 illustrates an exemplary process for providing an IC chip with multiple supply voltage compatibility, according to an embodiment of the present invention.

FIG. 5 illustrates a method 500 to implement the IC chip 102 with multiple supply voltage compatibility. FIG. 5 is described with reference to FIGS. 2 to 4. The order in which the methods are described is not intended to be construed as a limitation, and any number of the described method blocks can be combined in any order to implement the method, or an alternate method. Additionally, individual blocks may be deleted from the method without departing from the spirit and scope of the subject matter described herein. Furthermore, the methods can be implemented in any suitable hardware, software, firmware, or combination thereof.

At block 502, a supply voltage of an IC chip is sensed to generate a reference voltage. For example, the I/O supply voltage is sensed by the voltage reference generator 302 to generate the reference voltage 308. In an embodiment, when the core supply voltage is different from the I/O supply voltage, the I/O supply voltage is sensed to generate the reference voltage.

At block 504, a control signal is generated to select an appropriate supply voltage level based on the reference voltage. For example, the control signal, such as the bit lines 212, is generated by the control signal generator 304 based on the reference voltage 308 and the I/O supply voltage to configure the I/O cells 204 to operate at the I/O supply voltage. As is illustrated in FIG. 2, the control signal depicted by the bit lines 212 is routed to the I/O cells 204 through the digital rails 214. The control signal indicates the level of the I/O supply voltage to the I/O cells 204, and thus configuring the I/O cells 204 to meet the specifications of the peripheral circuit 104.

At block 506, an I/O cell of the IC chip is configured to operate at a supply voltage level of the I/O cell based on the control signal generated at block 504. For example, the power supply selector circuit 310 configures the I/O cell, for example, the I/O cell 204-1, to operate at the I/O supply voltage of the I/O cells 204 based on the control signal such as the bit lines 212. As depicted in FIG. 3, the power supply selector circuit 310 configures the functional circuit 312 to operate at the I/O supply voltage.

The I/O cell is configured to operate at the supply voltage level of the I/O cell without any manual intervention. Also, the I/O cells are configured without using any I/O pads, thereby providing a higher functionalities to chip size ratio. The method further employs a single voltage detector circuit to configure the I/O cells to operate at multiple I/O supply voltages. This reduces the size and complexity of the I/O cells and of the I/O ring.

Although embodiments for multiple supply voltage compatibility of the IC chip have been described in language specific to structural features and/or methods, it is to be understood that the appended claims are not necessarily limited to the specific features or methods described. Rather, the specific features and methods are disclosed as exemplary implementations for the multiple supply voltage compatibility.

I claim:

1. An integrated circuit (IC) chip comprising:
   a voltage detector circuit to generate, based on a level of an input-output (I/O) supply voltage, a control signal having a plurality of states, each state being associated with a corresponding level of the I/O supply voltage; and
   an I/O ring coupled to the voltage detector circuit, wherein the I/O ring comprises a plurality of I/O cells to operate, based on the state of the control signal, at the corresponding I/O supply voltage level.

2. The IC chip as claimed in claim 1, wherein the voltage detector circuit comprises a control signal generator to generate the control signal based on a reference voltage and on the level of the I/O supply voltage.

3. The IC chip as claimed in claim 2, wherein the control signal generator comprises comparators to generate the control signal.

4. The IC chip as claimed in claim 1, wherein the IC chip further comprises:
   a plurality of digital rails to receive the control signal from the voltage detector circuit and route the control signal to the I/O cells.

5. The IC chip as claimed in claim 4, wherein the digital rails are fabricated in the I/O ring.

6. The IC chip as claimed in claim 1, wherein the voltage detector circuit is in the I/O ring.

7. The IC chip as claimed in claim 1, wherein the IC chip further includes a core, and wherein the I/O ring surrounds the core.

8. The IC chip as claimed in claim 1, wherein the voltage detector circuit is in a filler cell of the I/O ring.

9. The IC chip as claimed in claim 1, wherein the voltage detector circuit is in a corner cell of the I/O ring.

10. The IC chip as claimed in claim 1, wherein the voltage detector circuit generates the control signal for at least four levels of the I/O supply voltage.

11. A method comprising:
    generating a control signal having a plurality of states each based on a corresponding level of an I/O supply voltage; and
    configuring, based on the state of the control signal, at least a part of an I/O ring of an IC chip to operate at the I/O supply voltage level.

12. The method of claim 11, wherein generating the control signal comprises:
    generating a reference voltage;
    generating a plurality of comparator voltages based on the I/O supply voltage; and
    comparing the reference voltage with each of the plurality of comparator voltages to generate the control signal.

13. The method of claim 11, wherein the control signal is generated for at least four levels of the I/O supply voltage.

14. The method of claim 11, comprising generating the control signal at the level of the I/O supply voltage.

15. An electronic device comprising:
a peripheral circuit; and
an IC chip coupled to the peripheral circuit, the IC chip comprising:
a core, and
an input-output (I/O) ring coupled to the core, the I/O ring comprising:
a voltage detector circuit to generate a control signal having a plurality of states each based on a corresponding level of an I/O supply voltage, and
a plurality of I/O cells to operate at the I/O supply voltage level based, at least in part, on the state of the control signal, and wherein the I/O cells exchange signals between the core and the peripheral circuit.

16. The electronic device as claimed in claim 15, wherein the I/O ring is disposed around the core.

17. The electronic device as claimed in claim 15, wherein the peripheral circuit and the IC chip form a single integrated chip.

18. The electronic device as claimed in claim 15, wherein the I/O ring further comprises a plurality of digital rails to receive the control signal from the voltage detector circuit and route the control signal to the I/O cells.

* * * * *